(12) United States Patent
Wolf et al.

(10) Patent No.: US 11,881,336 B2
(45) Date of Patent: Jan. 23, 2024

(54) RESISTOR ARRANGEMENT, MEASURING CIRCUIT COMPRISING A RESISTOR ARRANGEMENT AND METHODS FOR PRODUCING A STRIP-SHAPED MATERIAL FOR THE RESISTOR ARRANGEMENT

(71) Applicant: Wieland & Munich Electrification GmbH, Munich (DE)

(72) Inventors: Michael Wolf, Ulm (DE); Gerhard Thumm, Erbach (DE); Volker Voggeser, Senden (DE); Stefan Goede, Munich (DE); Konstantin Reichmeyer, Grafing (DE)

(73) Assignee: Wieland & Munich Electrification GmbH, Munich (DE)

( * ) Notice: Subject to any disclaimer, the term of this patent is extended or adjusted under 35 U.S.C. 154(b) by 356 days.

(21) Appl. No.: 17/152,479

(22) Filed: Jan. 19, 2021

(65) Prior Publication Data
US 2021/0225565 A1   Jul. 22, 2021

(30) Foreign Application Priority Data

Jan. 17, 2020   (DE) .................... 10 2020 101 070.2

(51) Int. Cl.
*G01R 1/20*       (2006.01)
*H01C 13/02*     (2006.01)
(Continued)

(52) U.S. Cl.
CPC .......... *H01C 13/02* (2013.01); *G01R 19/0038* (2013.01); *H01C 1/14* (2013.01)

(58) Field of Classification Search
CPC .... G01R 1/203; G01R 19/0038; H01C 13/02; H01C 7/06; H01C 7/20; H01C 1/14;
(Continued)

(56) References Cited

U.S. PATENT DOCUMENTS 6,097,276 A * 8/2000 Van Den Broek ... H01C 17/232
                                                            338/308
8,242,878 B2 * 8/2012 Smith .................. H01C 17/288
                                                            338/320
(Continued)

FOREIGN PATENT DOCUMENTS

DE         694 09 614 T2     11/1998
DE    10 2014 103 343 A1     9/2014
(Continued)

*Primary Examiner* — Thang X Le
(74) *Attorney, Agent, or Firm* — Muncy, Geissler, Olds & Lowe, P.C.

(57) ABSTRACT

A resistor arrangement having a first electrically conductive connection element and a second electrically conductive connection element, a first resistance element which is electrically conductively connected to the first connection element, a second resistance element which is electrically conductively connected to the second connection element, an electrically conductive intermediate element arranged between the first resistance element and the second resistance element and connected with these resistance elements in an electrically conductive manner, wherein the connection elements, the resistance elements and the intermediate element are arranged side by side in a row. The connection elements and the intermediate element on the one hand and the resistance elements on the other hand formed of different materials, wherein the material of the first resistance element differs from the material of the second resistance element.

20 Claims, 3 Drawing Sheets

(51) Int. Cl.
*G01R 19/00* (2006.01)
*H01C 1/14* (2006.01)

(58) Field of Classification Search
CPC ........ H01C 1/16; H01C 1/148; H01C 17/006; H01C 17/22
See application file for complete search history.

(56) References Cited

U.S. PATENT DOCUMENTS

| | | | |
|---|---|---|---|
| 9,343,208 B2 | 5/2016 | Tsukada et al. | |
| 9,523,270 B2 | 12/2016 | Ausserlechner et al. | |
| 9,972,424 B2 | 5/2018 | Hetzler | |
| 10,163,553 B2 * | 12/2018 | Kameko | H01C 17/28 |
| 10,438,730 B2 * | 10/2019 | Kao | G01R 1/203 |
| 10,794,006 B2 | 10/2020 | Phipps et al. | |
| 2010/0237982 A1 * | 9/2010 | Brackhan | H01C 3/06 29/610.1 |
| 2017/0243679 A1 * | 8/2017 | Hetzler | H01C 3/00 |
| 2020/0200799 A1 * | 6/2020 | Hung | H01C 1/14 |

FOREIGN PATENT DOCUMENTS

| | | |
|---|---|---|
| DE | 102014015805 B3 | 2/2016 |
| EP | 0 605 800 A1 | 7/1994 |
| KR | 20180003505 A | 1/2018 |
| KR | 10-2019-0003505 A | 1/2019 |

\* cited by examiner

RESISTOR ARRANGEMENT, MEASURING CIRCUIT COMPRISING A RESISTOR ARRANGEMENT AND METHODS FOR PRODUCING A STRIP-SHAPED MATERIAL FOR THE RESISTOR ARRANGEMENT

This nonprovisional application claims priority under 35 U.S.C. § 119(a) to German Patent Application No. DE 10 2020 101 070.2, which was filed in Germany on Jan. 17, 2020 and which is herein incorporated by reference.

BACKGROUND OF THE INVENTION

Field of the Invention

The present invention relates to a resistor arrangement having a first electrically conductive connection element and a second electrically conductive connection element, a first resistance element which is electrically connected to the first connection element, a second resistance element which is electrically connected to the second connection element, an electrically conductive intermediate element which is arranged between the first and second resistance element and is electrically conductively connected to these resistance elements, wherein the connection elements, the resistance elements and the intermediate element are arranged side by side in a row. The connection elements and the intermediate element on the one hand and the resistance elements on the other hand is formed of different materials, wherein the material of the first resistance element differs from the material of the second resistance element. The invention further relates to a measuring circuit comprising the resistor arrangement and a method for producing a strip-shaped material composite for the resistor arrangement.

Description of the Background Art

For measurement of current in electronic circuits, measurement resistors are used which are connected in series with the component to be monitored, wherein the current can be determined from the voltage dropping across the measuring resistor, known as the shunt resistor, or shunt for short. Correct and reliable current measurement is particularly important, e.g. in a battery management system of a hybrid or electric vehicle or for monitoring a fuel cell device.

Such a low-impedance measuring resistor as a shunt with about 10-50 µOhm can be made of a longitudinally welded material composite strip. This is known from EP 0 605 800 A1, for example. The material composite is made from three strips of material in that the individual metal strips are each connected with each other via a longitudinal seam using an electron or laser welding method.

The demands on correct and reliable current measurement in the present hybrid and electric vehicles, in which in some cases driving occurs at very high continuous currents, are increasing. With such currents, it is of great importance to monitor the safety-relevant components. In this context, the Li-ion batteries with their high energy density must be closely monitored in order to ensure they are always in a safe state of operation. The current measurement in the battery is therefore imperative for monitoring certain operating parameters such as the state of charge (SOC/state of charge) or the operating state (SOH/state of health) or the proper function (SOF/state of function). With a safety level in this area of application of up to ASIL C and D (ISO 26262), it is necessary to protect the relevant measuring instruments via a redundant function so that the safety level can be implemented at all.

The redundancy of the current measurement, which is necessary to achieve the safety level ASIL C, can be achieved by combining different sensors, i.e. the simultaneous detection of two completely different measurement signals, for example by measuring the voltage on a shunt resistor of known size and by measuring the Hall voltage on an energized conductor in a magnetic field. This structure is associated with relatively high costs, partly because the integration is low and many components are required requiring a corresponding amount of space.

The redundancy in the measured value acquisition can also be achieved by connecting a second shunt resistor in series to the first shunt resistor, instead of using the Hall voltage measurement, and by performing an independent voltage measurement on each of the two shunt resistors of the double shunt thus formed to determine the current strength. By comparing the two measurements, it can then be determined whether the measurements are plausible or whether there is an error. The double shunt thus enables the diagnosis of "single point faults", namely of drift, change in resistance, de-contacting of individual measurement taps. It further offers better diagnosis options for the shunt electronics by means of a plausibility check of the measurement by two shunt elements integrated in one component. The structure of the current measurement using a double shunt is simpler and less expensive than a current measurement using a single shunt and a Hall effect. The possibility of producing a multiple shunt is known from U.S. Pat. No. 9,343,208 B2.

However, with such a double shunt there is the possibility that both measurements are subject to the same error, for example due to a parallel drift of the two resistors.

SUMMARY OF THE INVENTION

It is therefore an object of the present invention to mitigate the known disadvantages.

The resistor measuring arrangement described above is characterized in that the two resistance elements are specifically made of different materials, in particular made of different substances which in particular may have different chemical compositions, wherein in particular CuMn10Ni4 and CuMn12Ni2 and CuMn14Ni2 and CuZn15Mn15Al can be named as examples of resistance alloys. The resistance measuring arrangement thus comprises material pairings made from these alloys, for example CuMn10Ni4 for the first resistance element and CuMn14Ni2 for the second resistance element.

This ensures in particular that the two resistance elements come from different production batches. Undetected errors in a batch, which may cause drifting, can therefore not occur simultaneously and in the same way in both resistance elements. This has the advantage of improving the redundancy of the measurement.

It is also provided that the two connection elements are plate-shaped and the intermediate element strip-shaped, and that the intermediate element is narrower than each of the two connection elements. As a result, material and space are saved because the intermediate element only has the function of receiving connections for the voltage measurement, but not devices for connecting to an electric circuit. The resistance elements can also be formed as strips.

Therefore, only the first connection element and the second connection element have connector for integration into a circuit, while the intermediate element cannot be connected to a circuit.

The thickness of the resistance elements is less than both the thickness of the connection elements and the thickness of the intermediate element, which offers advantages when mounting on a PCB (printed circuit board), for example, and also allows for soldering.

The design is selected such that the first resistance element has a thickness that differs from the thickness of the second resistance element. This enables a better adjusting of the resistance values of the two resistance elements.

It is further preferred if a first pair of measuring connection for measuring the electric voltage drop across the first resistance element and a second pair of measuring connections is provided for measuring the voltage drop across the second resistance element and if a first measuring connection from the first pair of measuring connections and a second measuring connection from the second pair of measuring connections are associated with the intermediate element.

Alternatively or in addition, there is the possibility of providing a pair of measuring connections to measure the drop in electric voltage across the first resistance element and a third pair of measuring connections to measure the cumulative drop in voltage across the first resistance element and the second resistance element.

When the resistance value of the first resistance element is lower than the resistance value of the second resistance element, in particular differs so greatly that the two voltages need to be measured with different measuring ranges, the independence of the measurement values is improved.

This resistor arrangement may, in particular, be integrated in a measuring circuit. The measuring circuit can then comprise a resistor arrangement as the one described above and a first voltage tap for measuring a first electrical voltage which drops across the first resistance element, a second voltage tap for measuring a second electrical voltage which includes at least the electrical voltage dropping across the second resistance element, and at least one electronic component for determining the first electrical voltage and the second electrical voltage.

The reliability of the measured values can be assessed using a comparator for comparing the measured first electrical voltage to the measured second electrical voltage.

The electronic component is preferably set up in such a way that the measurement of the first electrical voltage and the measurement of the second electrical voltage can take place independently of one another, so that a failure of one of the two measuring chains can be recognized by comparing the two measurements.

A method for producing a strip-shaped material composite comprises the following steps: (a) providing at least a first strip, a second strip and a third strip made of a material with high electrical conductivity, (b) providing at least a fourth strip and a fifth strip each made of a resistive material, wherein the material of the fourth strip and the material of the fifth strip differ from each other, and (c) longitudinal seam welding of the strips so that a composite of strips is formed in which the two strips made of resistive material each border one of the strips made of the material with high electrical conductivity along their two longitudinal edges.

There is the possibility that in step c) initially a first partial composite, which is formed of the first and fourth strip, and a second partial composite, which is formed of the second and third strip and the fifth strip arranged between these two strips, are each formed by longitudinal seam welding and then the first partial composite and the second partial composite are connected by longitudinal seam welding.

It is also provided that between method step b) and method step c) the strips are arranged in such a way that the fourth and fifth strip are each located between two strips made of a material with high electrical conductivity, and that one of the strips made of material with high electrical conductivity is located between the two strips made of resistive material. With this abovementioned method and its variants with regard to step c) and the implementation of the arrangement of the strips between method steps b) and c), a strip-shaped material composite is provided in which the step of severing the strip-shaped material composite transversely to the longitudinal direction of the strip produces and provides a resistor arrangement of the type described above.

There is also the possibility that the connector for connecting the resistor arrangement to a circuit are incorporated into the two connection elements.

Furthermore, at least one of the resistance elements can also be trimmed, by means of which the desired resistance value is set. The trimming takes place by shortening one resistance element so that the cross-sectional area of its line is reduced.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
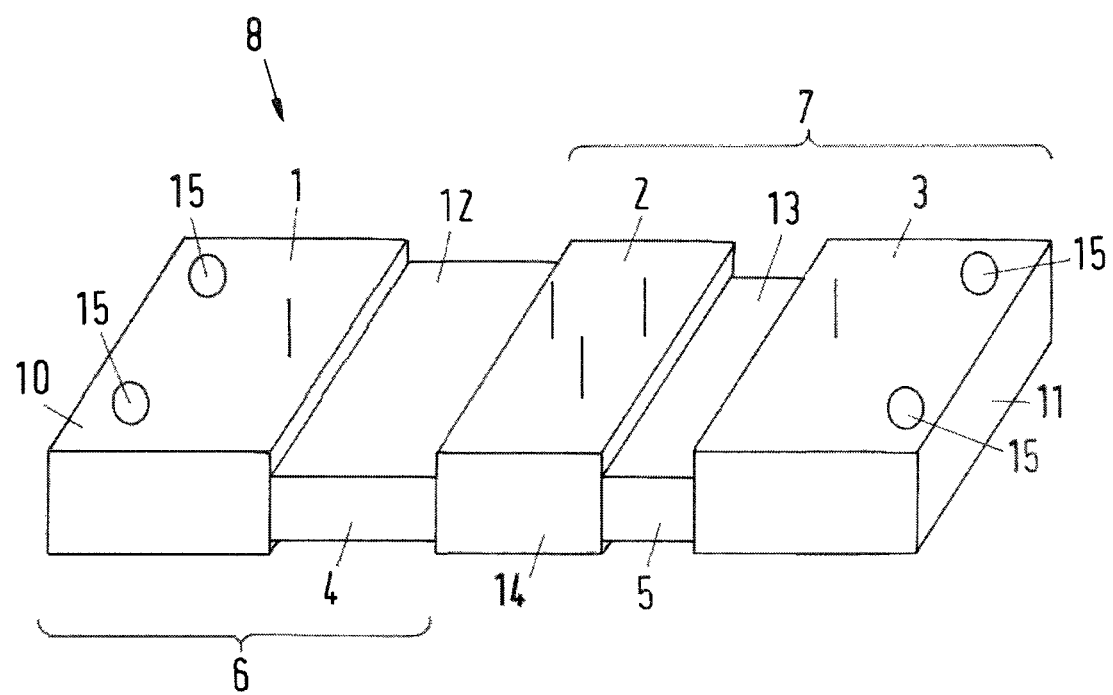
FIG. 1 is a perspective, schematic representation of a resistor arrangement.

FIG. 1 shows a resistor arrangement which is advantageously provided by a method for producing a strip-shaped material composite, the method comprising the following steps:

a) providing at least a first strip 1, a second strip 2 and a third strip 3 made of a material with high electrical conductivity, b) providing at least a fourth strip 4 and a fifth strip 5 each made of a resistive material, wherein the material of the fourth strip 4 differs from the material of the fifth strip 5, c) longitudinal seam welding of the strips 1, 2, 3, 4, 5, so that a composite of strips 1, 2, 3, 4, 5 is formed, in which the two strips of resistive material each border one of the strips 1, 2, 3 made of the material with high electrical conductivity along their two longitudinal edges.

There is the possibility that in step c) initially a first partial composite 6, which is formed of the first strip 1 and the fourth strip 4, and a second partial composite 7, which is formed of the second strip 2 and third strip 3 as well as the fifth strip 5 arranged between these two strips 2, 3, are each formed by longitudinal seam welding and then the first partial composite 6 and the second partial composite 7 are connected by longitudinal seam welding.

Alternatively, the method can also be modified in such a way that the strips are arranged between method step b) and method step c) such that the fourth strip 4 and the fifth strip 5 are each disposed between two strips made of a material with high electrical conductivity, and that one of the strips 2 of the material with high electrical conductivity is disposed between the two strips 4, 5 made of the resistive material.

When the strip-shaped material composite is then severed transversely to the strip length direction, a resistor arrangement 8 is produced which is characterized by the following structure:

a first electrically conductive connection element 10 and a second electrically conductive connection element 11, a first resistance element 12 which is electrically connected to the first connection element 10, a second resistance element 13 which is electrically connected to the second connection element 11, an electrically conductive intermediate element 14 which is disposed between the first resistance element 12 and the second resistance element 13 and is electrically conductively connected with these resistance elements 12, 13, wherein the connection elements 10, 11, the resistance elements 12, 13 and the intermediate element 14 are arranged side by side in a row, and wherein the connection elements 10, 11 and the intermediate element 14 on the one hand, and the resistance elements 12, 13 on the other hand formed of different materials. It is essential here that the material of the first resistance element 12 differs from the material of the second resistance element 13, so that a "parallel drift" of the two resistance elements 12, 13 or similar effects can be excluded more reliably than if both resistance elements 12, 13 were made of the same material or even of the same material batch.

The intermediate element 14 is formed as a strip and is narrower than each of the two plate-shaped connection elements 10, 11.

FIG. 1 shows that only the first connection element 10 and the second connection element 11 have connector 15 for integration into an electrical circuit, that is to say that the intermediate element 14 cannot be connected to an electrical circuit.

The thickness of the resistance elements 12, 13 is in each case less than both the thickness of the connection elements 10, 11 and the thickness of the intermediate element 14. This makes it possible in particular that the resistance elements 12, 13 are at a distance from a circuit board when the resistor arrangement 8 is attached to this circuit board. Trimming of at least one of the resistance elements 12, 13 when producing the resistor arrangement 8 is also more easily possible.

The first resistance element 12 also has a thickness which differs from the thickness of the second resistance element 13 such that it is possible to better adjust the resistance values of the two resistance elements 12, 13, in particular in view of the fact that the resistance value of the first resistance element 12 is smaller, particularly significantly smaller than the resistance value of the second resistance element 13, so as to impose different measuring ranges and improve the independence of the measured values.

Figure 2:
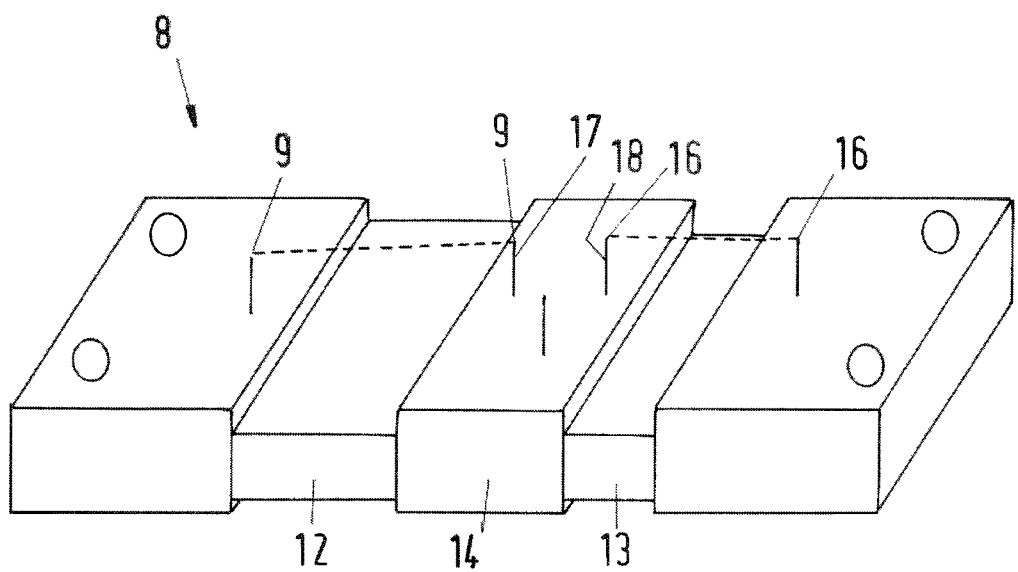
FIG. 2 is a representation corresponding to FIG. 1 with the connected first and second pair of measuring connections.

FIG. 2 shows that a first pair of measuring connections 9 for measuring the electrical voltage dropping across the first resistance element 12 and a second pair of measuring connections 16 for measuring the voltage dropping across the second resistance element 13 are provided, with a first measuring connection from the first pair of measuring connection and a second measuring connection from the second pair of measuring connections being assigned to the intermediate element 14.

Figure 3:
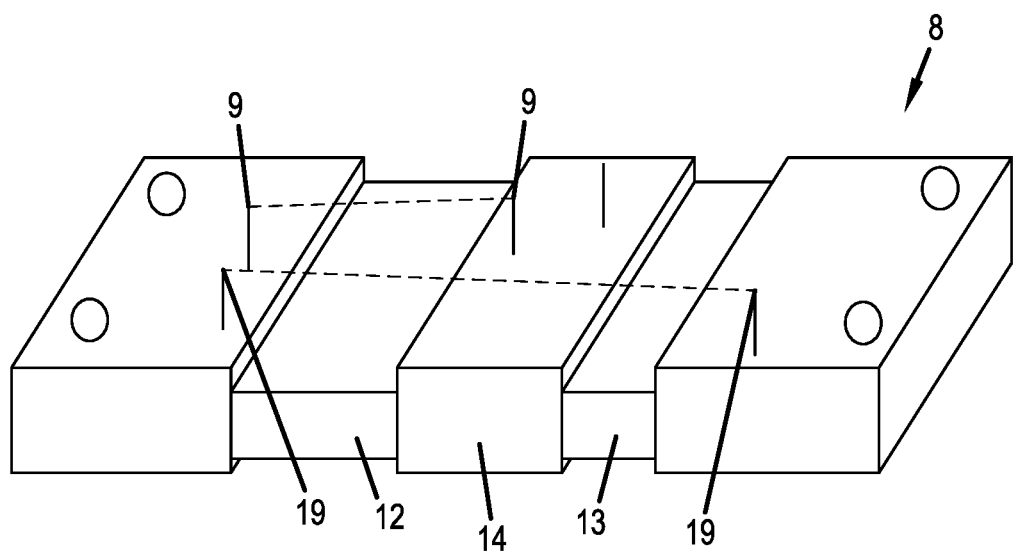
FIG. 3 is a representation corresponding to FIG. 1 with the connected first and the third pair of measuring connections.

However, there is also the possibility that the first pair of measuring connections 9 for measuring the electrical voltage dropping across the first resistance element 12 and a further pair of measuring connections 19 for measuring the cumulative voltage dropping across the first resistance element 12 and the second resistance element 13 voltage are provided, as shown in FIG. 3.

This measuring arrangement can be integrated in a measuring circuit, which comprises, in addition to the resistor arrangement 8, a first voltage tap for measuring a first electrical voltage, which drops across the first resistance element 12, a second voltage tap for measuring a second electrical voltage, which comprises at least the electrical voltage dropping across the second resistance element 13, and at least an electronic component for determining the first electrical voltage and the second electrical voltage, wherein a comparator is provided for comparing the measured first electrical voltage and the measured second electrical voltage, by means of which the reliability of the measured values can be assessed.

The electronic component is set up in such a way that the measurement of the first electrical voltage and the measurement of the second electrical voltage can take place independently of one another.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A resistor arrangement comprising:
   a first electrically conductive connection element;
   a second electrically conductive connection element;
   a first resistance element that is electrically conductively connected to the first connection element; and
   a second resistance element that is electrically conductively connected to the second connection element;
   an electrically conductive intermediate element that is arranged between the first resistance element and the second resistance element and is electrically conductively connected to the first and second resistance elements,
   wherein the first and second connection elements, the first and second resistance elements and the intermediate element are arranged side by side in a row,
   wherein the first and second connection elements and the intermediate element and the first and second resistance elements are formed of different materials,
   wherein a material of the first resistance element differs from a material of the second resistance element,
   wherein a first pair of measuring connections for measuring the electrical voltage dropping across the first resistance element and a second pair of measuring connections for measuring the voltage dropping across the second resistance element are provided, and wherein a first measuring connection from the first pair of measuring connections and a second measuring connection from the second pair of measuring connections are associated with the intermediate element.

2. The resistor arrangement according to claim 1, wherein the two connection elements are plate-shaped and the intermediate element is strip-shaped and wherein the intermediate element is narrower than each of the two connection elements.

3. The resistor arrangement according to claim 1, wherein only the first connection element and the second connection element are connectors for integration in a circuit.

4. The resistor arrangement according to claim 1, wherein a thickness of the first and second resistance elements is less than both a thickness of the connection elements and a thickness of the intermediate element.

5. The resistor arrangement according to claim 1, wherein the first resistance element has a thickness which differs from the thickness of the second resistance element.

6. A resistor arrangement comprising:
a first electrically conductive connection element;
a second electrically conductive connection element;
a first resistance element that is electrically conductively connected to the first connection element; and
a second resistance element that is electrically conductively connected to the second connection element;
an electrically conductive intermediate element that is arranged between the first resistance element and the second resistance element and is electrically conductively connected to the first and second resistance elements,
wherein the first and second connection elements, the first and second resistance elements and the intermediate element are arranged side by side in a row,
wherein the first and second connection elements and the intermediate element and the first and second resistance elements are formed of different materials, wherein a material of the first resistance element differs from a material of the second resistance element, and
wherein a first pair of measuring connections for measuring the electrical voltage dropping across the first resistance element and a further pair of measuring connections for measuring the cumulative voltage dropping across the first resistance element and the second resistance element are provided.

7. The resistor arrangement according to claim 6, wherein the resistance value of one of the resistance elements is smaller than the resistance value of the other resistance element.

8. A measuring circuit comprising:
a resistor arrangement comprising:
a first electrically conductive connection element;
a second electrically conductive connection element;
a first resistance element that is electrically conductively connected to the first connection element; and
a second resistance element that is electrically conductively connected to the second connection element;
an electrically conductive intermediate element that is arranged between the first resistance element and the second resistance element and is electrically conductively connected to the first and second resistance elements,
wherein the first and second connection elements, the first and second resistance elements and the intermediate element are arranged side by side in a row,
wherein the first and second connection elements and the intermediate element and the first and second resistance elements are formed of different materials, and
wherein a material of the first resistance element differs from a material of the second resistance element;
a first voltage tap for measuring a first electrical voltage that drops across the first resistance element;
a second voltage tap for measuring a second electrical voltage that comprises at least the electrical voltage dropping across the second resistance element; and
at least an electronic component for determining the first electrical voltage and the second electrical voltage.

9. The measuring circuit according to claim 8, further comprising a comparator for comparing the measured first electrical voltage and the measured second electrical voltage is provided.

10. The measuring circuit according to claim 8, wherein the electronic component is set up so that the measurement of the first electrical voltage and the measurement of the second electrical voltage can take place independently of one another.

11. A method for producing a strip-shaped material composite, the method comprising:
providing at least a first strip, a second strip and a third strip made of a material with high electrical conductivity;
providing at least a fourth strip and a fifth strip each made of a resistive material, wherein the material of the fourth strip and the material of the fifth strip differ from each other; and
longitudinal seam welding the strips so that a composite of strips is formed in which the two strips each made of resistive material in each case border one of the strips made of the material with high electrical conductivity along both their longitudinal edges.

12. The method according to claim 11, wherein, in said longitudinal seam welding of the strips, initially a first partial composite, which includes the first strip and the fourth strip, and a second partial composite, which includes the second strip and third strip and the fifth strip arranged between these two strips, are each formed by longitudinal seam welding and then the first partial composite and the second partial composite are connected by longitudinal seam welding.

13. The method according to claim 11, wherein, between said providing at least a fourth strip and a fifth strip and said longitudinal seam welding of the strips, the strips are arranged such that the fourth strip and the fifth strip are in each case disposed between two strips of a material with high electrical conductivity and wherein one of the strips of material with high electrical conductivity is located between the two strips made of resistive material.

14. The method according to claim 11, further comprising a-step of severing the strip-shaped material composite transversely to the longitudinal direction of the strip in order to produce a resistor arrangement.

15. The method according to claim 14, wherein the connector for connecting the resistor arrangement to a circuit is incorporated in the two connection elements.

16. The method according to claim 14, wherein at least one of the resistance elements is trimmed.

17. The method according to claim 11, wherein a first pair of measuring connections for measuring the electrical voltage dropping across the first resistance element and a second pair of measuring connections for measuring the voltage dropping across the second resistance element are provided, and wherein a first measuring connection from the first pair of measuring connections and a second measuring connection from the second pair of measuring connections are associated with the intermediate element.

18. The method according to claim 11, wherein a first pair of measuring connections for measuring the electrical voltage dropping across the first resistance element and a further pair of measuring connections for measuring the cumulative voltage dropping across the first resistance element and the second resistance element are provided.

19. A resistor arrangement comprising:
a first electrically conductive connection element;
a second electrically conductive connection element;
a first resistance element that is electrically conductively seam welded to the first connection element; and
a second resistance element that is electrically conductively seam welded to the second connection element;
an electrically conductive intermediate element that is arranged between the first resistance element and the second resistance element and is electrically conductively seam welded to the first and second resistance elements,
wherein the first and second connection elements, the first and second resistance elements and the intermediate element are arranged side by side in a row,
wherein the first and second connection elements and the intermediate element and the first and second resistance elements are formed of different materials, and
wherein a material of the first resistance element differs from a material of the second resistance element.

20. A resistor arrangement comprising:
a first electrically conductive connection element;
a second electrically conductive connection element;
a first resistance element that is electrically conductively connected to the first connection element; and
a second resistance element that is electrically conductively connected to the second connection element;
an electrically conductive intermediate element that is arranged between the first resistance element and the second resistance element and is electrically conductively connected to the first and second resistance elements,
wherein the first and second connection elements, the first and second resistance elements and the intermediate element are arranged side by side in a row,
wherein the first and second connection elements and the intermediate element and the first and second resistance elements are formed of different materials,
wherein a material of the first resistance element differs from a material of the second resistance element, and
wherein the first resistance element has a thickness which differs from the thickness of the second resistance element.

* * * * *